United States Patent [19]

Bille

[11] 4,214,522
[45] Jul. 29, 1980

[54] DEVICE FOR MANUFACTURING A STENCIL

[75] Inventor: Dag Bille, Särö, Sweden

[73] Assignee: Svecia Silkscreen Maskiner AB, Norsborg, Sweden

[21] Appl. No.: 899,859

[22] Filed: Apr. 25, 1978

[30] Foreign Application Priority Data

May 16, 1977 [SE] Sweden ............................. 7705695

[51] Int. Cl.$^2$ ............................................. B41C 1/14
[52] U.S. Cl. ................................ 101/128.4; 101/129; 354/325
[58] Field of Search .................... 101/128.4, 127, 114, 101/129; 354/325

[56] References Cited

U.S. PATENT DOCUMENTS

| 1,451,065 | 4/1923 | Dye | 354/325 |
| 1,624,781 | 4/1927 | Dye | 354/325 |

FOREIGN PATENT DOCUMENTS 1802533  6/1969  Fed. Rep. of Germany ........... 354/325
764412  12/1956  United Kingdom ..................... 354/325

OTHER PUBLICATIONS

Metalite; advertizing circular from Advance Process Supply Co. (Chicago, Illinois); Patent Off. Group date 5-17-76.

Primary Examiner—Edgar S. Burr
Assistant Examiner—A. J. Heinz
Attorney, Agent, or Firm—Burns, Doane, Swecker & Mathis

[57] ABSTRACT

An apparatus for manufacturing or treating a stencil intended for use in a silkscreen printing machine. The stencil has been lighttreated to transfer a design to a pre-treated net or film. The film being subjected to a water-treatment process to rinse the film to develop said pattern. The apparatus comprises at least two pipes having mutually facing nozzles and being arranged to co-act with a displaceable holder in a manner such one of said at least two pipes passes on the rear of the film and the other of said at least two pipes passes on the other side of said film.

19 Claims, 2 Drawing Figures

DEVICE FOR MANUFACTURING A STENCIL

FIELD OF THE PRESENT INVENTION

The present invention relates to an apparatus for manufacturing or treating (washing) a stencil, and more particularly, but not exclusively, a stencil for use with a silkscreen printing machine.

BACKGROUND OF THE PRESENT INVENTION

There are two principle methods by which a stencil for a silkscreen printing machine can be manufactured. One method is designated "indirect stencil method" and the other method is designated "direct stencil method".

The indirect stencil method utilizes a film, a so-called stencil film, comprising a carrier and a sheet of light sensitive material or a light sensitive emulsion applied on said carrier. The film is exposed to light from high powered lamps through a negative having the intended pattern, this pattern being transferred to the film by means of the light. The film is then hung up and the film and pattern rinsed with water. The end product is the stencil pattern. The stencil pattern is then removed and placed (rolled out) on a net stretched in a frame, with the emulsion facing the net, on which net the stencil pattern is allowed to dry somewhat, in order to be able to remove the carrier. The emulsion adheres to the net and dries completely.

A stencil produced in this manner can be used for petroleum based dyes, such as dyes based on thinners and the like.

The emulsion can be readily rinsed from an indirectly produced stencil, by spraying the same with water, and the net stretched on the frame can be re-used for other patterns.

In the case of stencils manufactured according to the direct method, there is used a net which is stretched in a frame and which is coated with a light-sensitive emulsion, normally of a nature different from the nature of the emulsion used in the indirect method. The light-sensitive emulsion is illuminated by highly powered lamps through a pattern, whereupon the emulsion hardens. Normally there is used a negative film and its pattern is transferred to the net and to the emulsion coated thereupon. The pattern is then rinsed with water and the emulsion permitted to dry.

A stencil produced in accordance with the direct method can be used for water-based dyes in addition to petroleum-based dyes.

This means that the emulsion used when manufacturing stencils according to the direct method can only be removed with difficulty and that water alone is not sufficient herefor.

In order to remove the emulsion from a stencil manufactured according to the direct method, it is necessary to first spray the stencil with a particular solution, normally containing sodium hypochlorite. Subsequent to spraying the stencil with this solution, the stencil must be allowed to stand and "mature", so that the solution can act upon the emulsion to loosen the same. Subsequent hereto, the stencil can be sprayed with water and the emulsion removed from the net.

A stencil manufactured according to the indirect method has been found to be much better than a stencil manufactured according to the direct method with regard to the print obtained when clearly defined lines are required and when fine grid-like configurations are to be produced. Further, a stencil made according to the indirect method can be used to particular advantage when producing multi-colour prints of grid-like configuration. The direct stencil method is particularly used when water-based dyes shall be used.

OBJECTS OF THE PRESENT INVENTION

An object of the present invention is to provide, within these technical fields, an apparatus for manufacturing or treating stencils which in addition thereto being able to produce stencils according to both the indirect and direct methods also has means by which the emulsion applied to a net stretched in a frame according to the direct stencil method can be readily removed. A stencil produced according to the indirect method offers no problem in this context, since the stencil can be cleansed solely with water.

There is also a need within the printing industry for a stencil-manufacturing apparatus whose size conforms with the size of the printing shop in which it is installed. Consequently it is a further object of the present invention to construct the apparatus in a manner such that it can be produced in different sizes in the easiest possible manner. To this end, the present invention provides the possibility of constructing the apparatus in a manner such that the means holding the spray arms for conducting the rinsing liquid has the form of a first displaceable frame structure arranged in a stationary, second frame structure. In this way it is possible to select the size of the stationary frame structure in dependence upon the size of the printing shop, which thus means that only the stationary frame structure will undergo changes in size to adapt the same to the size of the printing shop, whilst the displaceable frame structure or holder with associated devices thereon, comprises a standard unit.

Still a further object of the invention is to provide an apparatus so constructed that it produces the pattern more effectively than previously known apparatus, this being due to the fact that the apparatus comprises pipes having mutually facing nozzles arranged to be brought to opposite side of the film or net thereby to rinse the pattern thereon.

I this way, the film or net is flushed with water on both sides thereof.

Furthermore, the present invention enables emulsion to be readily removed from a stencil manufactured according to the direct method.

It is also possible by means of the invention to separate those solutions and liquids used, to pass these liquids to a re-circulating system thereby increasing their usefulness.

An apparatus of the aforementioned type can be caused to carry out the following tasks:
(a) develop indirect stencils,
(b) develop direct stencils (direct emulsion),
(c) remove emulsion with a washing solution, so-called strip solution,
(d) washing away the emulsion with water.

The apparatus can also be constructed to carry out only one or more of the above tasks.

The characterising features of an apparatus according to the present invention are set forth in the characterising clause of claim 1.

BRIEF DESCRIPTION OF THE ACCOMPANYING DRAWINGS

So that the invention will be more readily understood and further features thereof made apparent, one exemplary embodiment will now be described with reference to the accompanying drawings, in which FIG. 1 is a perspective view of a apparatus for producing a stencil, certain parts of said apparatus being shown in cross-section, and said stencil being particularly intended for use in a silkscreen printing machine, and FIG. 2 is a cross-sectional view of the apparatus shown in FIG. 1.

DESCRIPTION OF PREFERRED EMBODIMENTS

Although the apparatus of the illustrated embodiment exhibits two pairs of pipes, there is nothing to prevent three or more pairs of pipes being used, each pair being adapted to receive and to co-act with a valve arranged in the upper part of the spray ramp in a manner such that different solutions can be caused to pass to select pipes in dependence upon the setting of the valves.

Figure 1:
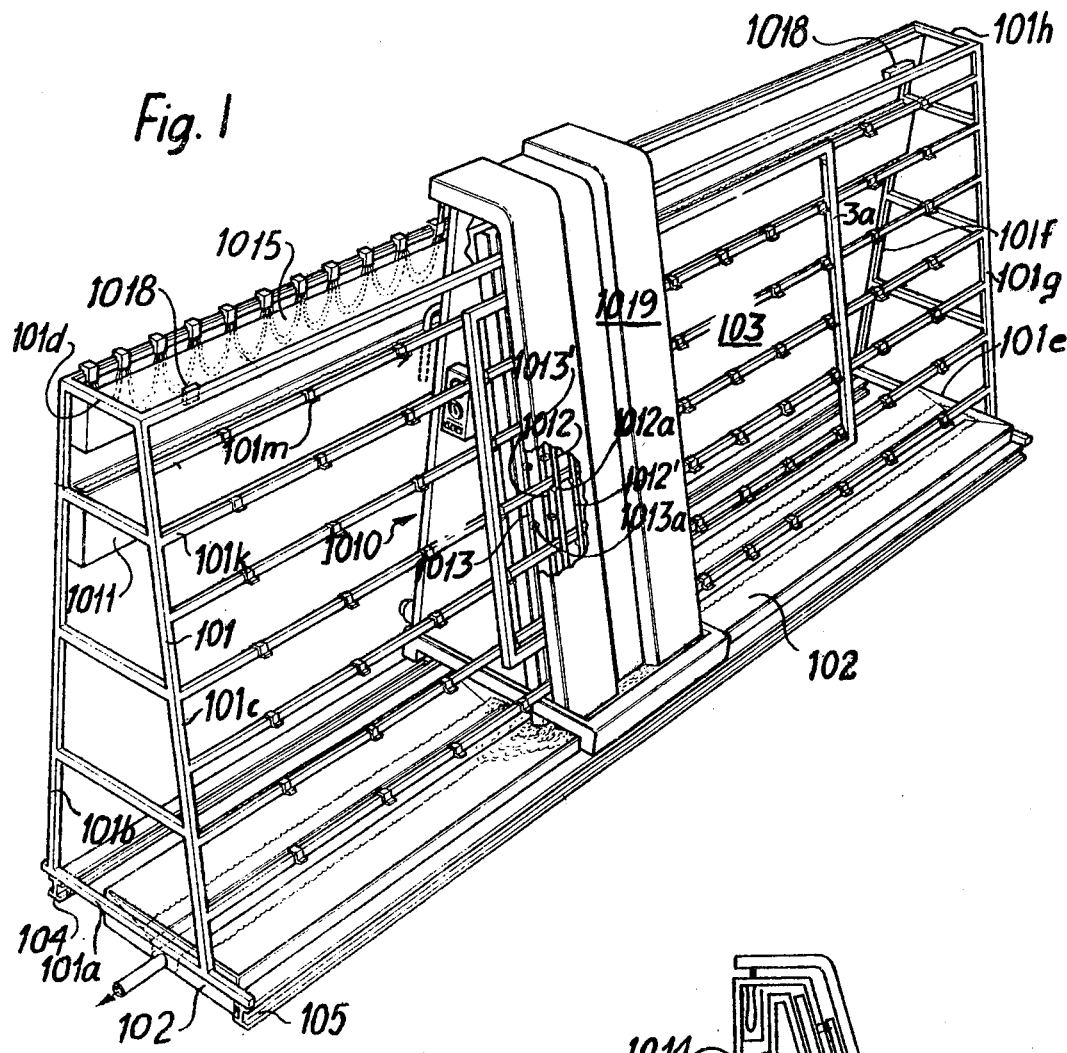
Figure 2:
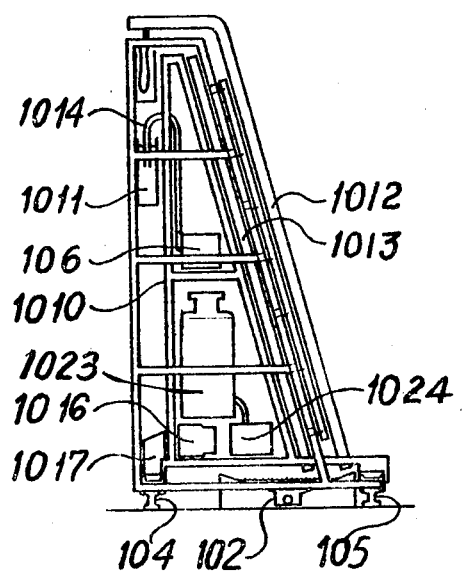

The apparatus 101 illustrated in FIGS. 1 and 2 represents a complete, combined apparatus with all functions and comprises a stationary frame 101 in the lower part of which is arranged an outlet or drip tray 102 adapted to receive liquid or solution sprayed onto a stencil 103 placed in a frame 3a. The stencil 103 is coated with an emulsion in accordance with the direct or indirect method of producing a stencil. Arranged on a respective side of the tray 102 are two channelled members 104 and 105 in which frame parts 101a, 101b and 101c are supported. These members form walls having the shape of a truncated right-angled triangle, the frame member 101d forming part of the triangular shape. The other end wall of the apparatus comprises, in a similar manner, frame parts 101e, 101f, 101g and 101h. Extending between the end walls are mutually parallel frame parts 101k, these frame parts being adapted to support the stencil 103 stretched in the frame 3a. The frame parts 101k also carry a plurality of holding means 101m for the frame 3a of the stencil 103.

Arranged within the stationary, outer frame structure 101 is a further frame structure 1010 which is arranged for movement along said outer frame structure. The frame structure 1010 has a shape corresponding to a truncated right-angled triangle and serves as a holding means for a plurality of components associated with the apparatus.

Thus, the inner frame structure 1010 carries a pump 106 which is adapted to pump water from a water carrier 1011 to forward and rearward rinsing arms 1012 and 1013. This is effected by means of the line 1014 and couplings (not shown) between the pump and the arms 1012 and 1013. Coupled to a container 1023 containing a washing liquid, so-called stripper, is a further pump 1024 which is adapted to pump washing liquid from the container 1023 to rinsing arms 1012' and 1013' by means of pipes not shown. The rinsing arms 1012 are located adjacent the arm 1012' while the rinsing arms 1013 are located adjacent the arm 1013'. Arranged in the upper part of the stationary frame structure is a cable carrier 1015 the cables of which are intended to supply electrical energy to electrical devices arranged in the displaceable frame structure.

Also arranged in the frame structure 101 is a drive motor 1016 which is coupled, preferably via a gear means 1017, to one or more drive wheels adapted to displace the holder 101a along the grooves 104 and 105. The illustrated apparatus has three such drive wheels.

The temperature of the water in the tank 1011 is maintained at a given, set level by means of heating device provided therefor. As with the FIG. 1 embodiment, the water pump is over dimensioned in order to allow nozzles for delivering large flows of water to be used. The water pump is coupled to the pipes 1012 and 1013 via means and hoses not shown, while the pump for pumping the solution in the tank 1013 is coupled to other, mutually parallel pipes 1012' and 1013' in a similar manner.

All of the four pipes are provided with respective nozzles 1012a and 1013a. The nozzles 1012a shall face the nozzles 1013a and the water pipe and pipes for washing liquid are preferably arranged parallel to one another.

The nozzles 1012a, 1013a are made of metal and are arranged to produce an abundant and uniform conveyance of liquid and liquid flow with overlapping spray patterns.

In order to ensure that the net or stencil is treated uniformly over the whole of its surface the spray arms or spray pipes are conveniently provided with a plurality of reduction valves, thereby to trim the spray pressure equally in a vertical direction.

The apparatus shown in FIG. 2 is provided with support rails 101k against which a film, with carrier and light-treated emulsion applied thereon, or a frame having stretched thereon a net coated with a light-sensitive emulsion and light-treated with high power lamps is arranged to rest. The film or frame is referenced 103. In the case of a film, the film is hung on pegs, while in the case of a fram frame 3a having a net 103 stretched thereon holding means 101m for the frame are provided, which holding means can be mounted on any of the support rails. It should be mentioned that when developing films or stencils produced according to the indirect method, a separate plate, preferably made of aluminum or plastics material, must be mounted against and in front of the guide rails prior to the stencils being mounted on pegs disposed on the plate.

It is also possible to hang a frame with a net stretched thereon and to permit said net to serve as a foundation for supporting the film. The inner frame structure, to which inter alia the pipe 1012 and 1013 are fixedly mounted, is conviently moved to one of its limit positions when the film or net 103 is to be placed in position. The drive motor 1016 is then activated to move the frame structure laterally along the film or net 103. The drive from the motor 1016 is transferred via a gear means 1017 to a rubber wheel which abuts and drives against the groove 104. As with the previously described apparatus, this arrangement ensures a quiet operation and prevents skidding in the case of overloads. The wheels need not be a separate item or made of rubber. It is also possible to arrange for one or two of the support wheels to serve as a drive wheel. Such an arrangement would also provide the anti-skid means for overloads.

The apparatus shown in FIG. 2 also comprises a displaceable, magnetic limit switch by means of which the limit position, between which the inner frame structure is moveable and can be set. The electrical control, which is dependent upon the setting position of the magnetic limit switch, is not illustrated in the drawing and does not form part of the invention.

The electrical couplings for the aforementioned functions are well known within this technical field and do not comprise part of the present invention.

Thus, as with the FIG. 1 embodiment, the cloth or film is arranged to pass between the two facing tubes 1012 and 1013 with their mutually facing nozzles 1012a, 1013a, such that the net or film 103 can be sprayed with water on both sides thereof. These pipes are arranged to co-operate with the inner frame structure, which is displaceably arranged along the net or film, so as to form the stencil subsequent to treatment. Thus, certain pipes are placed on the rear side of the guide 101k while other pipes are placed on the forward side of said guides.

It will be noticed, that the illustrated embodiments also has a plate 1019 which covers the pipes in a manner such as define an aera beyound which liquid and particularly liquid delivered by the nozzles 1012, 1013a, cannot pass.

Two pairs of pipes having nozzles are arranged on the inner frame structure on respective sides of the stencil 103, one pair of pipes with the nozzles facing towardes each other being intended to spray water onto the net or film, while the other pair of pipes are intended to convey a washing solution capable of removing emulsion applied to a net in accordance with the direct method of producing a stencil.

Although the illustrated embodiment has seven guides 101k extending parallel and horizontally between pairs of pipes and between the end wall of the apparatus, in a manner such as to support the cloth or film, the apparatus is not restricted to this number or support but can be provided with more or less than the number shown. Furthermore, the support rails may be removeably attached to respective end wall.

The pressure applied to one pipe may be different to that applied to another pipe, and preferably the pressure applied to the forward pipe is higher than the pressure applied to the rearward pipe. It is desirable in this respect, for a larger quantity of liquid to be sprayed onto the forward side of the stencil than on the rearward side thereof. To this end, the nozzles may be of mutually different design or size, so as to obtain said larger quantity of liquid on the forward side of the net or film than on the rearward side thereof. Alternatively, the pipes on the rearward side of the net or film may be provided with a throttle device or constriction.

Although the illustrated apparatus has two pairs of pipes, there is nothing to prevent three or more pairs of pipes being used, respective pairs being adapted to convey solution or liquid. One pair of pipes may also be caused to co-operate with valves in the upper part of the holder so that different solutions can be passed to the pipes in dependence upon the setting position of the valves.

The development of stencils manufactured in accordance with the indirect method firstly require a curing or hardening process with, for example, hydrogen peroxide. Devices constructed for fulfilling this necessary function may be incorporated in the apparatus together with a recirculation system for the hardener. In this respect, the spray system should be constructed as to only spray from the front side.

Although the invention has been described with reference to preferred embodiments thereof, it is not restricted thereto, but can be modified within the scope of the following claims.

What is claimed is:

1. An apparatus for treating a stencil intended for use in a silkscreen printing machine which has been light-treated to transfer a design to a pre-treated net or film, said stencil being subjected to a water-treatment process to rinse the stencil to develop said pattern, comprising:
   at least two vertically extending pipes having mutually facing nozzles and arranged on a displaceable holder in a manner such that one of said at least two pipes passes on the rear side of the stencil and the other of said at least two pipes passes on the forward side of said stencil,
   means for supporting a stencil between the two vertical pipes and means for supporting said holder for substantially horizontal movement such that each side of the stencil will be respectively traversed by said pipes, and
   means for supplying water to said pipes to treat a stencil supported on said supporting means.

2. An apparatus according to claim 1, characterised in that there are provided two pairs of pipes with associated mutually opposing nozzles, respective ones of said pairs being arranged on a respective side of the stencil, wherein one pair of pipes is adapted to spray the stencil or film with water, and wherein the other pair of pipes are intended to convey a solution capable of removing emulsion applied to the stencil.

3. An apparatus according to claim 1, wherein said support means includes horizontally extending support rails arranged parallel to one another between said at least two pipes, said support rails being adapted to support said stencil.

4. An apparatus according to claim 1, characterised in that means are provided for applying pressures of different magnitudes to respective pipes.

5. An apparatus according to claim 4, characterised in that the nozzle of respective pipes are constructed to deliver a larger quantity of liquid to the forward side of the stencil than to its rear side.

6. An apparatus according to claim 4 or 5, characterised in that one of said pipes has a construction.

7. The apparatus of claim 1 wherein said water supply means includes a pump mounted on said displaceable holder.

8. The apparatus of claim 1 wherein said supporting means includes a stationary frame structure and said displaceable holder comprises a second frame structure movable within said stationary frame.

9. An apparatus according to claim 8, characterised in that a water basin extends along the whole length of the stationary frame structure.

10. An apparatus according to claim 8, characterised in that a cable guide is arranged to extend along the whole of the length of the stationary frame structure.

11. An apparatus according to claim 8, characterised in that the frame structure is provided with means for supporting a container for a washing liquid and a pump coupled to said container.

12. An apparatus according to claim 8, characterised in that an outlet tray extends along the whole of the length of the stationary frame structure.

13. An apparatus according to claim 8, characterised in that the second frame structure is arranged to rest on two parallel chanelled elements, and that said frame structure is provided at the lower part thereof with wheels engaging the channels of said elements.

14. An apparatus according to claim 13, characterised in that at least one wheel is arranged to be driven by a drive motor fixedly mounted on the second frame structure.

15. An apparatus according to claim 8, characterised in that two pairs of vertically extending pipes having nozzles associated therewith are arranged on the second frame structure in a manner to be located on respective sides of the stencil, and in that one pair of pipes with associated nozzles facing each other is intended to convey water for spraying the stencil, while the other pair of pipes is intended to convey a washing solution capable of removing emulsion applied to the stencil.

16. An apparatus according to claim 15, characterised in that guide rails extend horizontally and parallel to one another between the respective pipes of said pairs in the stationary frame structure, said rails being adapted to support the stencil.

17. An apparatus according to claim 15, characterised in that means are provided for varying the pressure applied to the different pipes.

18. An apparatus according to claim 17, characterised in that the nozzles of a pipe serving the rear side of the stencil is arranged to supply a larger qunatity of liquid to said rear side than the nozzles serving the front side of said stencil.

19. An apparatus according to claim 17 or 18, characterised in that the pipes are provided with throttle valves for regulating the spray pressure.

* * * * *